United States Patent [19]

Inoue et al.

[11] Patent Number: 5,449,948
[45] Date of Patent: Sep. 12, 1995

[54] SEMICONDUCTOR INTEGRATED CIRCUIT DEVICES INCLUDING MEANS FOR REDUCING NOISE GENERATED BY HIGH FREQUENCY INTERNAL CIRCUITRY

[75] Inventors: Hirokazu Inoue, Tokai; Tomoji Oishi, Hitachi; Hiroichi Shinohara, Hitachi; Ken Takahashi, Tokai; Tetsuo Nakazawa, Tomobe; Mitsuo Usami, Oume; Masaki Fukuoka, Hitachi, all of Japan

[73] Assignee: Hitachi, Ltd., Tokyo, Japan

[21] Appl. No.: 678,852

[22] Filed: Apr. 1, 1991

[30] Foreign Application Priority Data

Mar. 30, 1990 [JP] Japan .................................. 2-80755

[51] Int. Cl.⁶ ........................................... H01L 27/02
[52] U.S. Cl. ..................................... 257/531; 257/532; 257/535
[58] Field of Search ................ 357/51; 257/531, 532, 257/533, 535

[56] References Cited

U.S. PATENT DOCUMENTS

| | | | |
|---|---|---|---|
| 4,599,705 | 7/1986 | Holmberg et al. | 357/51 |
| 4,626,881 | 12/1986 | Kishi et al. | 357/51 |
| 4,737,830 | 7/1988 | Patel et al. | 257/296 |
| 4,891,684 | 1/1990 | Nishioka et al. | 357/51 |
| 5,011,784 | 7/1991 | Ratnakumar | 357/43 |
| 5,032,892 | 7/1991 | Chern et al. | 357/51 |

Primary Examiner—J. Carroll
Attorney, Agent, or Firm—Antonelli, Terry, Stout & Kraus

[57] ABSTRACT

Integrated circuit devices, chips and methods of making and operating them are disclosed. The devices are specially adapted for high frequency operation e.g. at or above 1 GHz. Inductive noise caused by switching at these frequencies—and which can interfere with switching—is inhibited by using a large bypass capacitor connected between power and ground connections outside the chip, and a small bypass capacitor connected between the same power and ground connections but formed inside the chip. The smaller capacitor cuts noise attributable to the wiring between the larger capacitor and the chip. The chip can have many of the smaller capacitors, even one or more per gate. In the preferred embodiments, the small capacitors from power and ground bonding pads are formed at the front surface of the chip substrate. Tantalum pentoxide, and other suitable dielectrics having relative dielectric constant of 10 or more at 1 GHz, are used to form the capacitors.

8 Claims, 13 Drawing Sheets

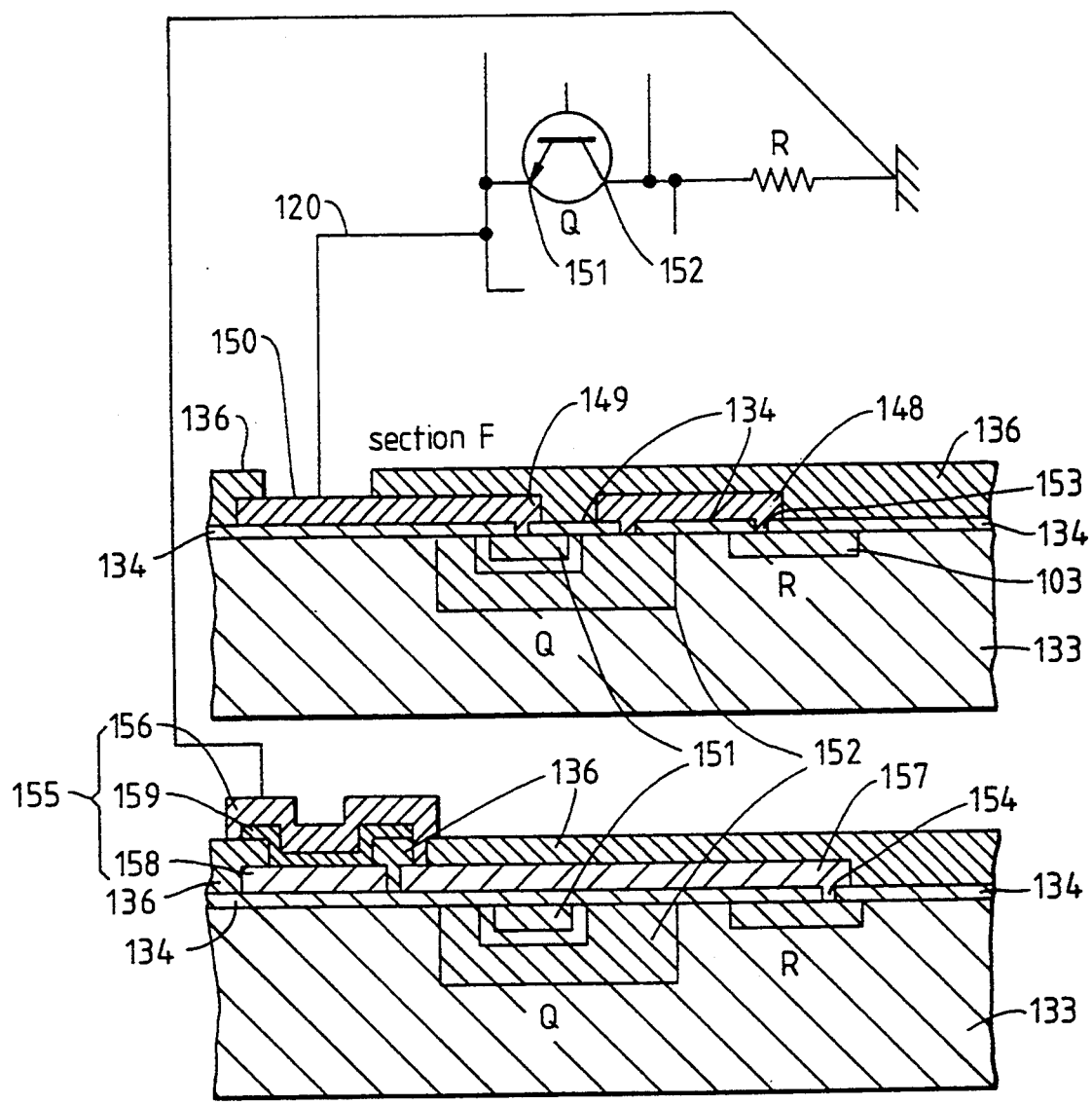

SEMICONDUCTOR INTEGRATED CIRCUIT DEVICES INCLUDING MEANS FOR REDUCING NOISE GENERATED BY HIGH FREQUENCY INTERNAL CIRCUITRY

FIELD OF THE INVENTION

This invention relates to semiconductor integrated circuit devices, more particularly to integrated circuit chips, devices incorporating such chips, and methods of operating the devices at high operating speeds.

BACKGROUND OF THE INVENTION

In recent years, electronic computers and other integrated circuit products have had an increasing tendency towards higher operating speeds. As operating speed increases, the problems of noise within the circuitry and malfunctions attributable to the noise become more serious. Principal sources of such noise are firstly the fluctuation of power source voltage, attributed to switching, and secondly the interaction between signal paths i.e. crosstalk.

Any wiring line in a circuit has an inductive component. The size of voltage fluctuation, i.e. noise, caused by this inductive component is proportional to the frequency at which the line is operating. Thus, at high operational frequencies, the inductive contribution of the wiring lines becomes a significant contribution to noise. This is particularly so in a fast-operating electronic computer, in which the operating voltage is generally low; since the induced noise voltages based on induction are not dependent on the power source voltage but on the frequency, their size becomes relatively large and causes a problem.

It is well known to reduce noise due to e.g. power source voltage fluctuation, by inserting a capacitor appropriately in the power source path between the power source and Ground. Usually this is called a "bypass capacitor".

It is known that, to be effective, a bypass capacitor should be positioned as close as possible to the noise Generating source, since the wiring line between the capacitor and the source can give rise to further inductive noise. In an electronic computer, particular noise generation sources are the switching portions or "gates" which lie at the heart of the computer. The operation of these gates Generates noise, and this noise at the same time tends to cause malfunction of neighbouring gates. Accordingly, it is important to install a bypass capacitor close to these switching portions, e.g. a logic LSI, a RAM module, a VRLSI, or a DRAM (dynamic random access memory) in a computer.

Prior Art

JP-A-61/137354 discloses that a noise-reducing bypass capacitor can be provided in a particularly compact way, with the aim of saving space, by forming a dielectric layer on the rear surface (i.e. the surface not having the internal circuitry and terminals) of the chip, and superimposing a lead frame electrode layer on this dielectric layer to form a capacitor at the back of the chip instead of a space-consuming exterior capacitor. Despite using the entire chip rear surface to make the capacitor as large as possible, the smoothing effect is poor. It will not work in a high speed computer.

JP-A-61/269317 also discloses forming a capacitive element using the rear surface of a semiconductor chip for formation of a dielectric layer, with a conductive layer superimposed. Noise reduction is suggested as one possible use for the capacitor, but in reality this capacitor would provide only a very small reduction and certainly insufficient for a high-speed computer. Other documents disclose the formation of capacitors in IC chip internal circuitry, as circuit components. For example, JP-A-62/200804 discloses IC chip circuitry including a number of capacitors, for an oscillator circuit.

JP-A-63/110652 discloses how to form a capacitor suitable for use as a charge-storing (memory) capacitor in an IC chip.

JP-A-63/35129 describes an integrated circuit chip having internal circuits, in which a signal is fed to the circuits through bonding pads forming a capacitor and Zener diode to prevent harmful electrostatic build-up in the circuit.

The last three above-mentioned prior art documents disclose capacitors comprised in integrated circuit chips, but they are not suitable for use as bypass capacitors since they have no connection between power and ground.

SUMMARY OF THE INVENTION

In view of the above, it is an object of the invention to provide new means for noise reduction in integrated circuit devices, and preferably noise reduction sufficient to enable use in high frequency circuitry such as in a high-speed computer.

According to one aspect, the present invention provides a semiconductor integrated circuit device in which an integrated circuit chip, having high frequency-operable internal circuitry, is disposed in an external system comprising means for making electrical connection to the IC chip, in particular at least a power source connection and a ground connection for the chip circuitry. A first, larger capacitor is connected between the power source connection and the ground connection externally of the chip—as in the prior art—but a second, smaller capacitor, is also connected between the power connection and ground and comprised in the integrated circuit chip itself.

In this way we find that excellent noise reduction may be obtained. The larger, external capacitor reduces major noise in the external system, while inductive noises arising between the larger capacitor and the internal circuitry of the chip are substantially reduced by the relatively small capacitor in the chip. In using two capacitances serving one internal circuit, the present concepts tend to run against the general trend towards simplicity and space-saving. However, we find that, with these new concepts, special advantages are obtainable. In particular, we may be able to obtain a good smoothing (noise reduction) effect with very high frequency (high speed) integrated circuitry e.g. operating at signal frequencies of the order of 1 GHz or higher. At present, such frequencies are used only in a limited number of semiconductor circuit systems. However, their use is likely to become more widespread, in particular in very high-speed computing where switching noise raises a very serious problem.

In very high frequency systems, we find that the total combined capacitance of the external and chip capacitors is preferably at least 0.1 $\mu$F. More generally, preferably the external capacitance is at least 0.05 $\mu$F, while the said capacitance provided in the chip totals at least 100 pF while being less than the external capacitance.

In one aspect, the chip comprises a plurality of the smaller capacitances contributing to the total chip bypass capacitance. Desirably, each of these small capacitors has a capacitance of at least 100 pF. However a lesser capacitance may be sufficient: even 0.5 pF would have a significant smoothing effect if it could be positioned right at the switching gate itself.

Commonly, the integrated circuit chip will include a plurality of internal circuit portions. For example, an IC chip for a computer may contain a plurality of switching gates e.g. 1000 or more, contributing to a logical operation carried out by the chip circuitry. These internal circitry elements may involve a plurality of power connections. In this case, we prefer to provide the second, smaller capacitance in the chip in connection with the plurality of power connections for the chip circuitry. Said bypass capacitance comprised in the chip may comprise a single capacitor connected as bypass for plural power source connections. More preferably, the capacitance in the chip comprises plural separate capacitors, since then the failure of one of the capacitors does not lead to failure of the entire chip. Most preferably, the chip has a plurality of internal circuitry power source connections, each of which has a respective said bypass capacitor comprised in the chip.

In a particularly preferred version, each of a plurality of gates in the chip circuitry has a respective capacitor in the chip.

In further aspects, the invention provides semiconductor integrated circuit chips for use in the devices of the aspect described above.

In one such aspect, a semiconductor integrated circuit chip comprising high frequency operable internal circuitry and power and ground connections for the internal circuitry, further comprises at least one capacitor in the chip connected between the power and ground connections and positioned at least in part less than 100 μm from the circuitry for which it is connected.

More preferably, this spacing of the capacitor from its relevant circuitry e.g. a gate, is less than 10 μm at least at some point.

This very short distance between the chip bypass capacitance and its associated circuitry is advantageous to reduce as far as possible the inductive component of wiring between the capacitance and the circuit.

In another such aspect, a semiconductor integrated circuit chip comprising high frequency operable internal circuitry and power and ground connections for the internal circuitry, further comprises at least one capacitor in the chip connected between the power and ground connections and which is positioned at the front surface of the chip.

A suitable location for the formation of such a capacitor is at a bonding pad for the power and/or ground connection. Various preferred bonding pad configurations are discussed below. In one preferred version, outer electrode layers forming respective bonding pads are positioned adjacent one another, and overlap respective inner conductive layers with a dielectric between, to form a capacitance. The inner layers may be separate capacitor electrodes, or wiring layers within the chip, To increase the capacitance available to each outer bonding electrode, it is electrically cross-connected to the inner layer underneath the adjacent outer electrode. Where the inner layers are separate capacitor electrodes, the outer layers may connect past or through them to wiring layers beneath.

A dielectric layer used to form the capacitor or capacitors of the chip preferably has a relative dielectric constant of at least 10 and more preferably at least 20.

Further aspects of the invention concern special composite oxide dielectrics having very high relative dielectric constants, and methods for making them.

Method aspects of the invention also include methods comprising making the chips in accordance with the invention, including the small capacitor(s) connected between the power and ground connections. The manufacture process may involve creating a plurality of capacitors, or part-formed capacitors, in respect of a given circuit or circuit block within the chip, testing these to see whether any are faulty, and making the chip with only the sound capacitors connected between power and ground.

The invention also includes a method of operating high-frequency circuitry such as a high-speed computer, in which the small capacitor(s) in the chip and larger capacitor outside the chip are used together to reduce noise, particularly switching noise and interference.

BRIEF DESCRIPTION OF THE DRAWINGS

Concepts relating to the invention, and a number of specific embodiments, are now described with reference to the accompanying drawings in which:

FIG. 6 shows a cross-section through a part of an emitter-controlled-logic circuit as shown in FIG. 3, in vertical cross-section, and also shows how this is adapted in accordance with the invention by forming a grounded capacitor at a bonding pad thereof;

DETAILED DESCRIPTION OF PREFERRED EMBODIMENTS

Some concepts underlying the invention are first discussed.

Any wiring line has an inductive component. See FIG. 1. Near capacitor 101 at a point A, almost no voltage fluctuation arises when a switch 102 is turned on. At point B near the switch 102, a voltage fluctuation is caused by an inductive component (indicated symbolically by coils 100) in the wiring line between A and B. The value of the voltage fluctuation attributable to induction is frequency-proportional. When the signal becomes fast, therefore, the inductive component of the wiring line ceases to be negligible. In an electronic computer, operating voltage is fundamentally low and power source voltages and logic amplitudes are decreasing over the years with the increase in microfabrication of elements. Since the switching-induced voltage fluctuations depend not on the power source voltage but on the frequency, the significance of these fluctuations is becoming greater all the time.

The inventors have now identified the following criteria for using a bypass capacitor to reduce these voltage fluctuations.

(1) The capacitor should be inside a semiconductor chip, or on its front surface, to bring it as close as possible to the switching location.

(2) The capacitor must be connected between power and ground.

(3) As mentioned above, the capacitor is positioned as near as possible to a gate in order to prevent delay of signal propagation. A capacitor close to a gate may however give rise to stray capacitance and lower switching speed. Preferably therefore the capacitor should be at least one micron from the gate and signal wiring lines connecting to the gates. This preferred minimum distance will vary according to the structure, however.

(4) It is desirable to avoid a construction in which charging or discharging current flows within the IC chip substrate. Such currents can cause fluctuation of gate potential and reduction of the noise margin for switching.

Figure 3:
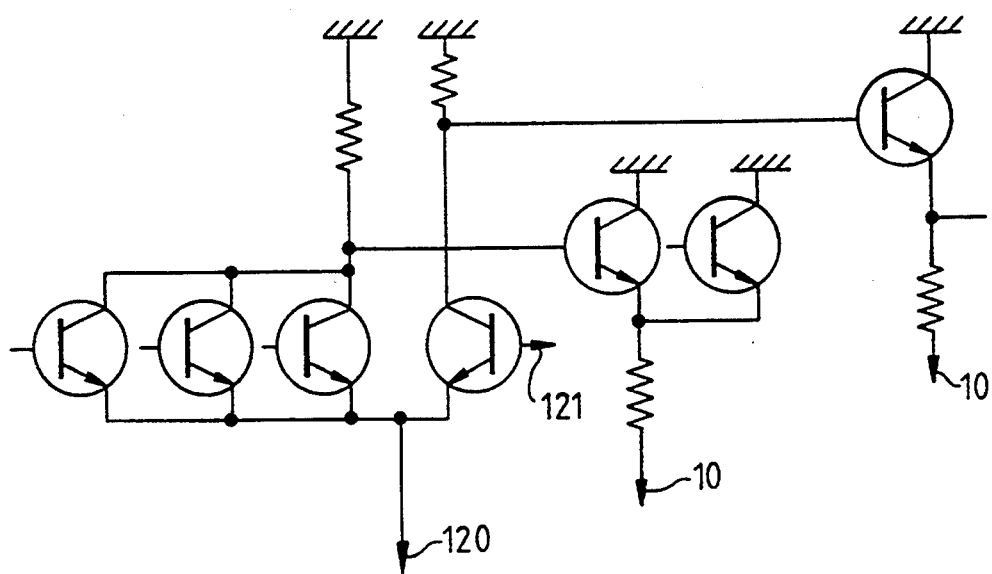
FIG. 3 shows a circuit system using a plurality of power source voltages.

(5) Plural power source blocks existing in a semiconductor IC chip are preferably furnished with respective independent bypass capacitors. It is common practice, particularly in integrated circuits providing a high-speed operation, to divide the interior of the chip into several blocks with independent respective power sources. Capacitors serving these power source lines must be electrically independent of one another. Furthermore there are types of circuit, such as the emitter-coupled logic (ECL) shown in FIG. 3, which require plural power source voltages for the one circuit. FIG. 3 shows three voltage types $V_{EE}120$, $V_{BB}121$ and $V_{TT}10$ for which a good effect cannot be expected using just one capacitor in each IC chip. The ideal noise-prevention effect can be expected when a capacitor is provided for every gate.

Figure 2A:
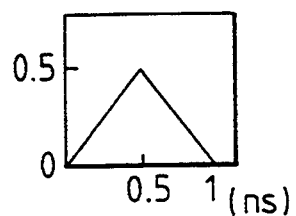
FIG. 2(a) shows an induced current wave form.
Figure 2B:
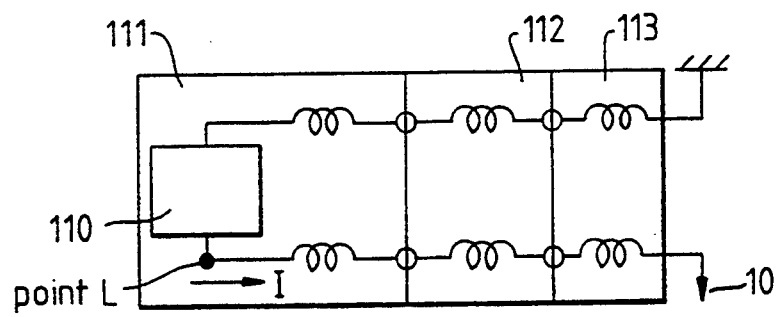
FIGS. 2(b) to 2(d) are schematic illustrations of circuit inductances and the effects of inserting capacitances.
Figure 2C:
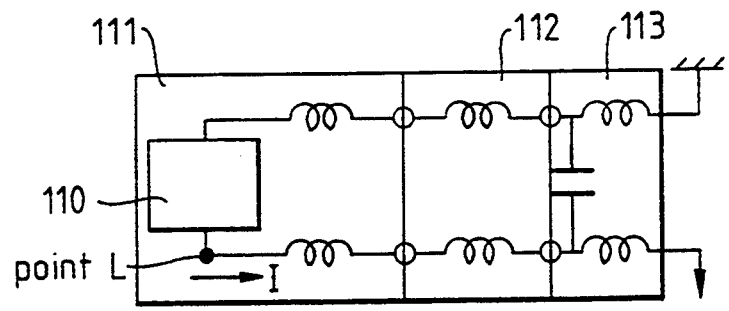
Figure 2D:
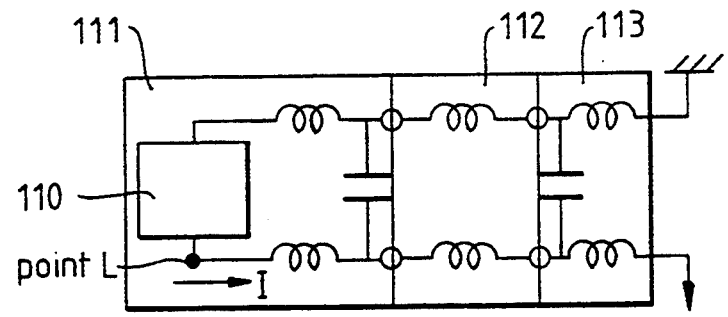

FIGS. 2(a) to 2(d) illustrates a further concept relating to the invention. FIG. 2(i) shows a current wave form characteristic caused when a switching circuit 110 is turned from ON to OFF within a fixed time period. FIGS. 2(b) to 2(d) show schematically an IC 111 including the switching circuit 110. The right-hand block 113 represents a printed wiring board, and the middle block 112 a package 112 which carries the IC 111 and has terminals connecting to the board 113. The ground connection and the power line 10 extend away from the circuit 110 to the right i.e. progreessively further and further away from the switching.

FIG. 2(b) shows a situation in which no anti-noise measure is taken. The schematic coils represent the inductance of the wiring lines. The noise voltage at point L is one volt. FIG. 2(c) shows a bypass capacitor of 0.1 $\mu$F connected between the power and ground terminals on the printed wiring board 113, near to the terminals of the package 112. This arrangement is known in the prior are for noise reduction. The value of the noise voltage at point L is about 50 mV i.e. about one twentieth of that in FIG. 2(b). The residual noise voltage is mostly attributable to inductive components arising between the capacitor and the switching circuit 110. It can be reduced somewhat by enlarging the capacitor, but only to an extent of some mV. FIG. 2(d) shows an additional capacitor of 100 pF connected between power and ground in close proximity to the switching circuit, specifically, within the IC 111. By this measure, the previous residual noise is reduced by more than half. This schematic example uses a 100 pF capacitor, but of course the actual capacitance will vary according to the type of circuit and the space available for its installation. The remaining noise voltage is mostly attributable to wiring lines within the IC 111 itself. So, while in FIG. 2(d) the capacitor has been connected comparatively far away from the circuit 110 in the IC 111, the reduction in noise voltage can be increased by connecting the capacitor as near to the switching circuit 110 as possible. So, a comparatively large capacitance installed outside the integrated circuit 111, e.g. on a printed wiring board 113, combined with a smaller capacitance installed in or on the IC 111, lead to a possibility for good suppression of noise voltages.

Ideally, the small bypass capacitor is disposed within the switching circuit 110. In this case, it may be possible to obtain a smoothing effect with a capacitance as small as 0.5 pF or less, depending upon other circuit factors.

Figure 4A:
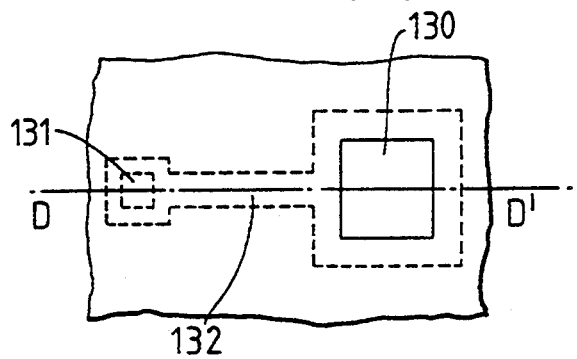
FIG. 4(a) and FIG. 4(b) are respectively a plan and vertical cross-section at D-D' of a wire bonding region of an IC.
Figure 4B:
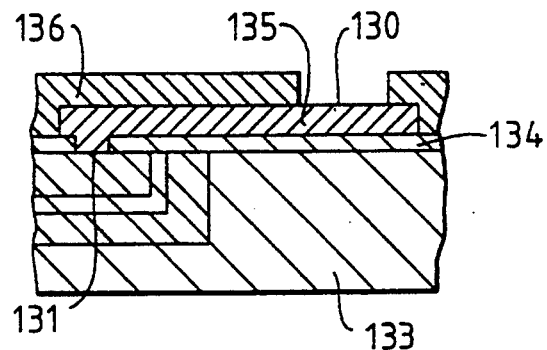

With reference to FIGS. 4(a) and 4(b) we now describe a capacitor construction which can be used in making embodiments of the invention. FIGS. 4(a) and (b) are respectively plan and vertical sectional fragmentary views of a simple wire bonding portion of an IC. This shows a bonding pad portion 130 for bonding to an external wire lead, an internal wiring line 132 extending away from the exposed bonding pad portion 130, and a connection portion 131 for connecting through into an internal circuit. The construction is conventionally arranged on the front surface of a silicon substrate 133 covered with an insulating oxide film 134 which protects the interior. An aluminium element forms the bonding pad, connection portion and wiring line portions mentioned above. They are made up by an aluminium wiring line 135 extending along the surface above the insulation layer, and connecting electrically to the internal circuit (here, the emitter of a bipolar transistor) through a hole in the oxide film 134. At the other end of the aluminium wiring line 135, the aluminium element is enlarged into a bonding pad portion 130. Except for the bonding pad portion 130, the IC surface is covered with a chemical vapour-deposited silicon oxide film 136 to protect the wiring.

Figure 5A:
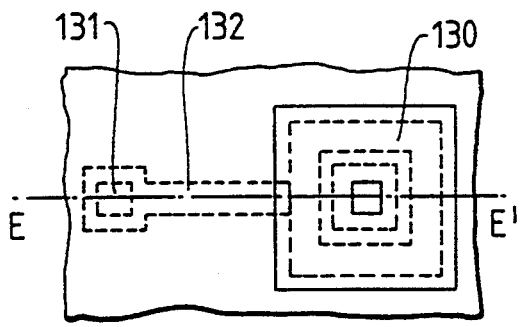
FIGS. 5(a) and 5(b) are views corresponding to FIG. 4 (with section at E-E') in which the wire bonding region has been formed with a capacitor useful in embodiments of the invention.
Figure 5B:
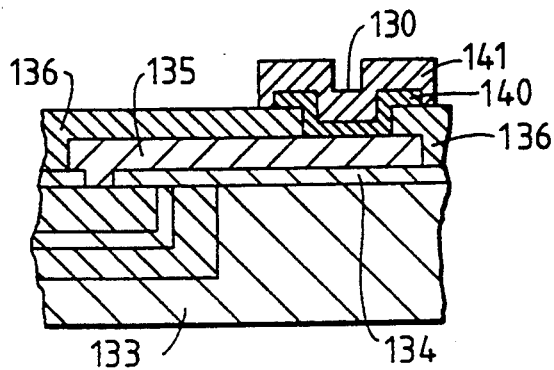

FIGS. 5(a) and (b) are corresponding views showing how the bonding pad construction can be provided with a capacitor. As seen in FIG. 5(b), a high-permittivity layer 140 and an upper electrode 141 are layered on top of the previously exposed bonding pad portion 130. This forms a capacitor in which the high-permittivity layer 140 is the dielectric, while the upper electrode layer 141 and the bonding pad portion 130 of the aluminium wiring line 135 function as the capacitor poles.

It might be thought that the silicon oxide film 136 could function satisfactorily as a capacitor dielectric layer. In fact, the film 136 is provided primarily to protect the interior of the IC from moisture, ion attack and the like. It is made fairly thick—several microns—and has a very small relative dielectric constant of about 3. Since the capacitance is inversely proportional to thickness and proportional to the relative dielectric constant, the film 136 would give a very low capacitance of no practical use. This will always be so, since for high IC operating speed it is necessary that the front surface film have a low dielectric constant.

A further question is that of whether the high-permittivity i.e. high dielectric constant layer 140 will have an adverse influence on the internal circuit. High dielectric constant layer 140 is shielded from the silicon substrate 133 by the aluminium wiring line 135. Wiring line 135 is a power source or ground line and thus forms an effective shield. So, the presence of the high dielectric layer 140 does not increase stray capacitance in the circuit in the silicon substrate 133 although it provides an effective capacitance at the bonding pad.

FIGS. 5(a) and 5(b) show only the capacitor constructed at the bonding pad, but not the connections enabling it to function as a bypass. Such connections are exemplified in FIG. 6. The top of FIG. 6 shows as a circuit diagram the relevant circuit components which are as taken from the ECL circuit shown in FIG. 3 at power connection 120.

The top portion of FIG. 6 shows the construction with a conventional bonding pad. In FIG. 6, conventional exposed bonding pad 150 connected (by means not shown) to the power source $V_{EE}$120 of a package (not shown) is joined to the emitter 151 of a transistor Q by an aluminium wiring line 149. The transistor Q and a resistor R are formed in the silicon substrate 133 at locations spaced away from the bonding pad, by conventional diffusive means. Aluminium wiring line 149 from the bonding pad connects to the transistor emitter through a hole in the insulating film 134. A further aluminium wiring line 148 connects to the collector 152 of the transistor through a further through-hole, and to one through-hole of the resistor 103. The view does not show base wiring.

The lower portion of FIG. 6 shows a different section where features embodying the invention are included. Bonding pad 155 now forms a capacitor having upper electrode layer 156, intermediate high dielectric layer 159 and lower electrode layer 158. Upper electrode layer 156 is connected to a ground wiring line of the package (not seen in this section, but indicated schematically vis a vis the circuit diagram). Lower bonding pad electrode 158 is connected to the power source $V_{EE}$120 by the same connection as the conventional bonding pad 150 in the section of upper portion of FIG. 6. From adjacent the bonding pad, a long aluminium wiring line 157 extends past the transistor and connects via through-hole 154 to the far end of the resistor 103 and at its other end, through the top oxide layer 136, to the upper electrode 156 of the capacitive bonding pad 155. So, the capacitor at bonding pad 155 is connected between power source $V_{EE}$120 and ground, and constitutes a bypass capacitor.

It will be noted that in the construction shown, aluminium wiring line 157 is shown as a long line necessarily leading past other components. This does arise in some cases. More sophisticated embodiments will be described later in which measures are taken to avoid this. Also, the construction described shows the capacitor formed at the power source terminal bonding pad 155. It will be appreciated that it may be formed at the ground terminal, or at some location between these terminals.

We now consider the ability of a capacitor of this construction to serve its purpose and withstand practical use.

The capacitance C of a capacitor is expressed by the following formula:

$$C = \epsilon_0 \epsilon_r \frac{S}{t}$$

in which $\epsilon_0$ is the permittivity of free space $(8.85 \times 10^{-12}\, Fm^{-1})$, $\epsilon_r$ is relative dielectric constant S is electrode area, and t is the dielectric thickness.

Bonding pads are generally at least 100 microns square and this can be assumed as a minimum for S. A preferred dielectric used herein is tantalum pentoxide and this has $\epsilon_r = 30$. To withstand a voltage of 10 v or more, the dielectric thickness is set at about 0.01 microns. On the basis of the above formula, this provides a capacitance of about 270 pF. In fact a capacitance down to 100 pF will give a satisfactory noise reduction effect when used in the way shown, in combination with a suitable external bypass capacitor. Clearly therefore an adapted bonding pad as shown will be able to provide practical usefulness.

This should be contrasted with the situation in the prior art, in which the idea of a bypass capacitor constructed on a tiny area such as that of a bonding pad was quite inconceivable. Previously, this would have been thought quite inadequate as a smoothing capacitor, and quite pointless since the small noises encountered in conventional low frequency circuitry were satisfactorily reduced by having an external capacitor connected near the chip. The inductive component appearing in and around a chip would not normally ever be more than 1 nH. The present inventors by contrast have shown how even a very small capacitor arranged in the chip can lead to a vital noise reduction when handling very high frequency signals e.g. at or above 1 GHz.

A number of capacitor arrangements for chips are now described.

Figure 7A:
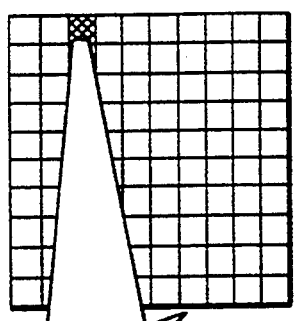
FIG. 7 illustrates schematically the larger and smaller scale structure of an IC chip.
Figure 7B:
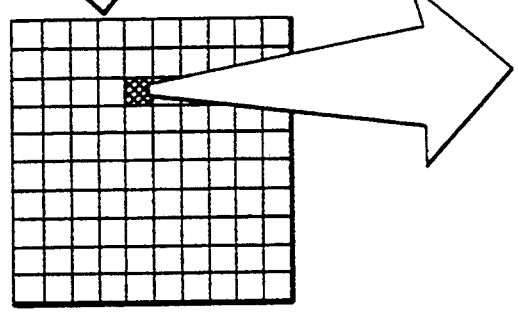
Figure 7C:
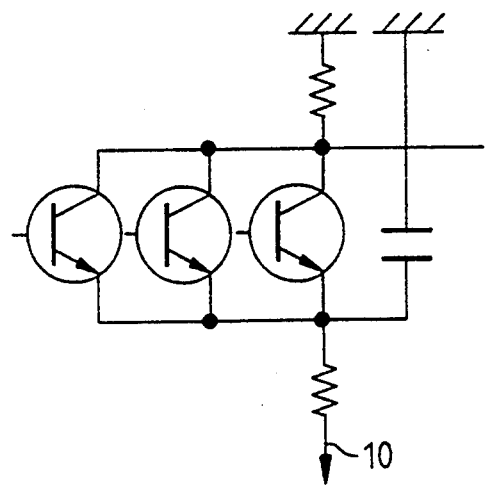

FIG. 7 shows schematically an integrated circuit chip, without its bonding pads, consisting of a large number of circuit blocks. These are shown in FIG. 7(a) as small squares. One of these is schematically enlarged to form view (b) showing how each block itself can be decomposed to smallest possible circuit units. The smallest units are minimum switching units such as shown in view (c). These are called "gates". FIG. 7(c) also shows a bypass capacitor comprised in the gate, in accordance with the invention.

Figure 8:
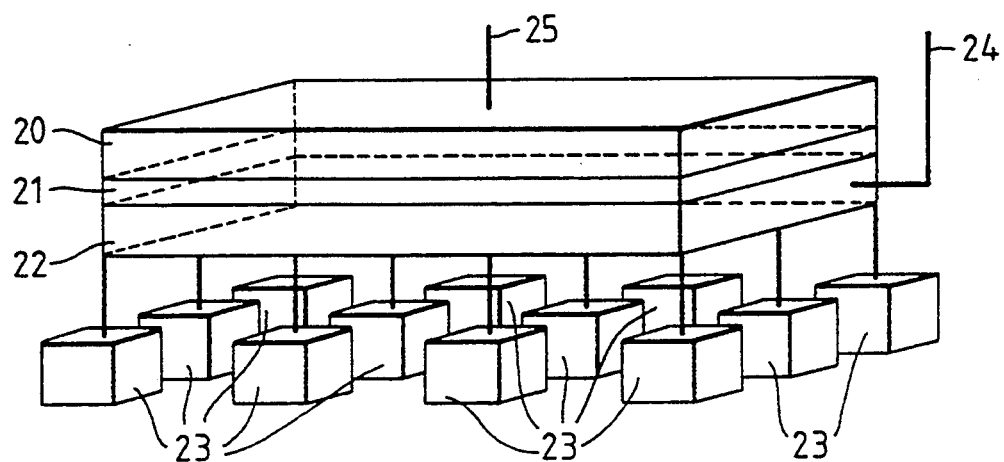
FIG. 8 is a schematic perspective view of a chip construction in a first embodiment of the invention.

FIG. 8 shows in schematic perspective the relationship of a bypass capacitor and a number of switching gates, comprised in a semiconductor chip. A ground line 25 connects to an upper aluminium electrode layer extending over substantially the entire front surface of the chip. Lying directly underneath the upper aluminium electrode 20 is a tantalum pentoxide dielectric layer 21 of corresponding area, and under the dielectric layer 21 a lower aluminium electrode layer 22. Beneath these layers 20, 21, 22 which form a capacitor at the front of the chip, are disposed many gate circuits 23 in the silicon chip. The chip itself if not shown in this schematic view. A power line 24 for the chip is connected from the exterior to the bottom aluminium electrode layer 22, and power sub-connections extend down from this layer to the respective switching gates 23. The ground of each gate 23 is connected via a respective sub-connection up to the top aluminium electrode layer 20 of the capacitor formed at the front of the chip, but these ground connections are not shown for the sake of clarity.

So, in this embodiment the power sources 24 and grounds 25 of all the gates 23 are connected in parallel.

Figure 9:
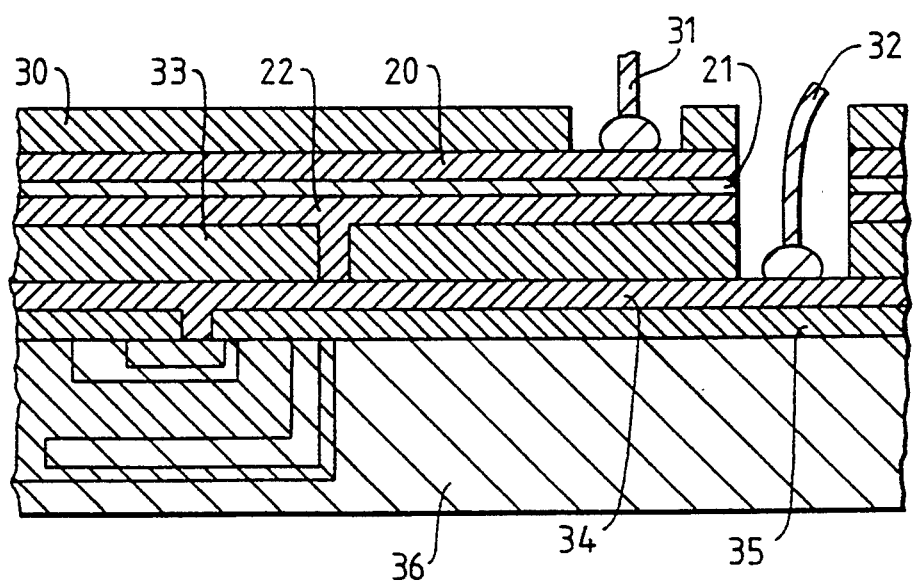
FIG. 9 is a vertical cross-section of part of the first embodiment.

FIG. 9 shows in vertical enlarged cross-section, and with greater verisimilitude, a bonding pad portion of part of the chip represented by FIG. 8. It will be seen how top aluminium electrode 20 is generally protected by a surface protective layer 30 while leaving a small portion exposed for bonding by a piece of ground wiring line bonding wire 31. Above the silicon substrate 36 including the gates 23, and separated from it by a low-permittivity insulating layer 35, is a power source wiring layer 34 which has downward through-connections to the power inputs of the gates, and upward connections, through a thick low-permittivity silicon oxide layer 33, to the bottom electrode 22 of the capacitor at the front surface. Silicon oxide film 33 was made thick enough e.g. 3 microns, to avoid reduction in switching speed caused by the presence of the front capacitor 20, 21, 22. Power connection bonding wire 32 is connected to the power wiring layer 34 through a hole penetrating the upper layers. The tantalum pentoxide film 21 in the integrated front capacitor was about 100 nm thick, and was selected to exhibit a sufficiently high dielectric constant and a low dielectric loss at high frequencies i.e. at or above 1 GHz. The silicon chip had dimensions of about 5 mm, so the integrated bypass capacitance achieved was about 0.05 $\mu$F. In combination with an exterior bypass capacitor of 0.5 $\mu$F, shielding the chip from major inductive components outside the chip, the integrated capacitor gave effective noise reduction protection to the many gates 23.

Figure 10:
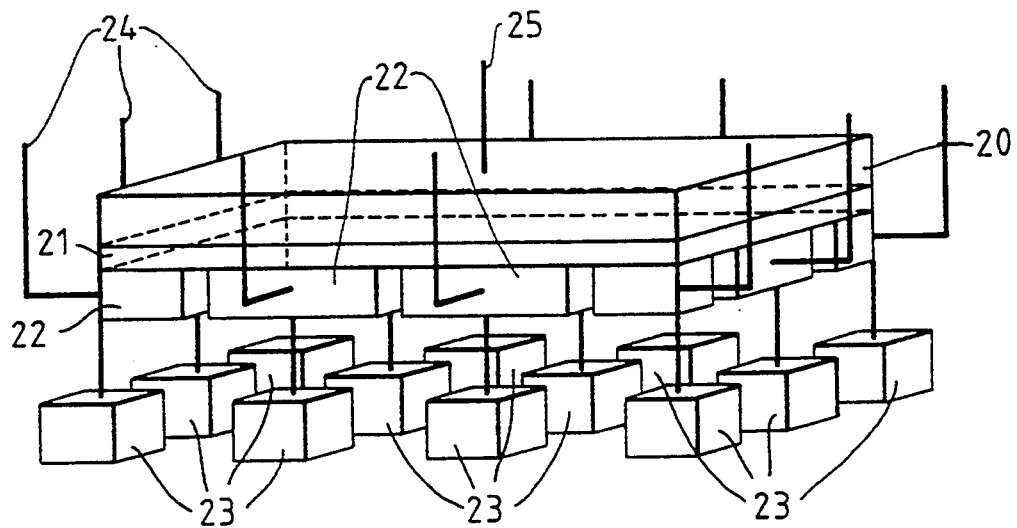
FIG. 10 is a schematic perspective view showing a chip construction in a second embodiment.

FIG. 10 is a perspective schematic view of the capacitor and gate arrangements in a second embodiment of chip. The arrangement of layers and connections at the chip surface was achieved in the same manner as in the first embodiment, with reference to FIG. 9. The second embodiment differs in that the lower aluminium electrode layer 22 of the integrated capacitor is divided into a number of separate portions, one for each switching gate 23. This construction reduces or eliminates interference of power source noise between the various gates 23, and hence enables a smoother operation than in the first embodiment. The sub-divided lower electrode 22 does however require a corresponding plurality of power connections 24 and hence pieces of bonding wire 32 as shown in FIG. 9. This embodiment is therefore more structurally complicated. Also, because of the smaller lower electrodes, and with the number of gates 23 being about 1000, the capacitance per gate is less. In one example the tantalum pentoxide layer 21 was made thinner than in the first embodiment, and a capacitance of 50 pF per gate was achieved.

Figure 11A:
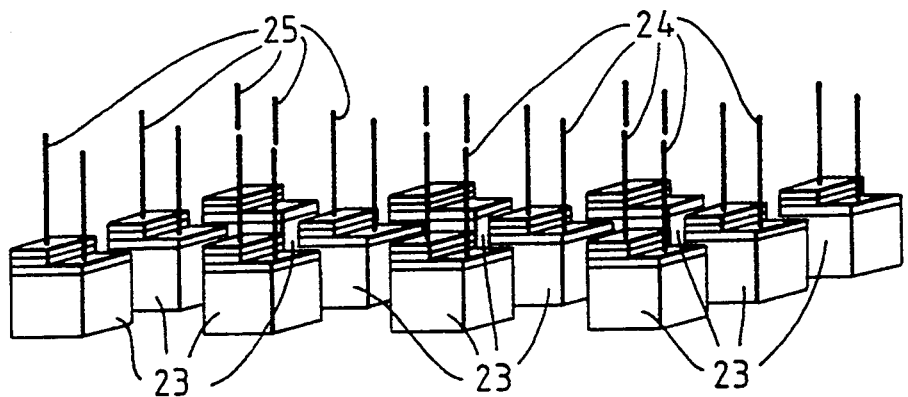
FIG. 11(a) is a schematic perspective view showing a chip construction in a third embodiment.
Figure 11B:
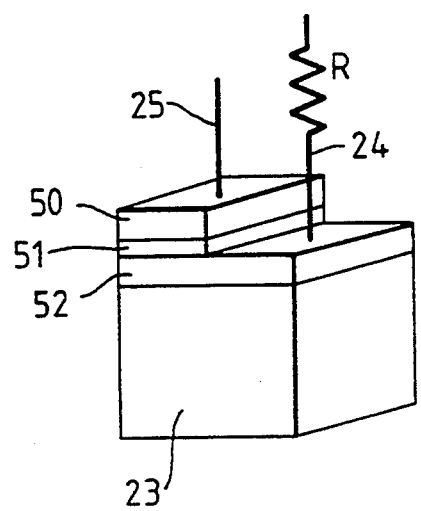
FIG. 11(b) is an in enlarged detail thereof.

FIGS. 11(a) and (b) are schematic perspectives of the same nature as FIGS. 8 and 10, illustrating a third embodiment. In this embodiment, a separate respective capacitor is provided for each of the many gates 23. This corresponds to the capacitor in the individual gate shown in FIG. 7(c) mentioned above. The upper aluminium electrode layer 50 of each capacitor is connected to the ground 25 for its respective gate 23. Similarly, the lower aluminium electrode 52 of the capacitor is connected to a respective power line via a resistor R (shown in FIG. 11(b)) for every gate. With this structure, the capacitor is formed at the gate 23, as a part thereof, and connected to the power source 24 via resistor R. So, even when the number of bonding pads on the silicon chip is not equal to the number of gates as was the case in the second embodiment, interferences among the power source lines of the gates 23 can be reduced or eliminated. In that respective, this construction enables a Greater density of integration.

Figure 12:
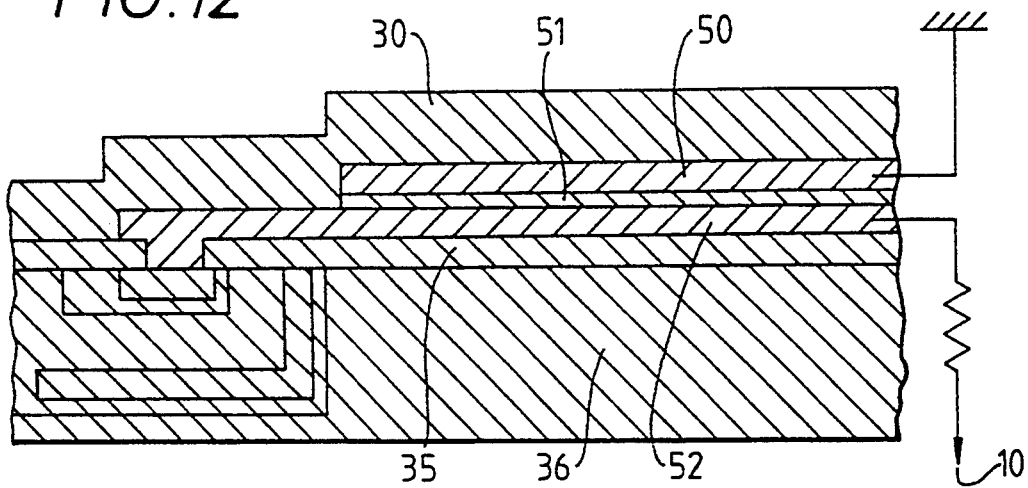
FIG. 12 is a vertical cross-section at one gate of the third embodiment.

FIG. 12 shows in cross-section part of the capacitor construction used in this embodiment. It should be noted that, unlike the first and second embodiments, this embodiment arranges the capacitor 50, 51, 52 without the thick low-permittivity layer separating it from the silicon substrate. Instead, lowering of switching speed is avoided by having no circuit element at all in the region under the capacitor. No power source wiring layer 34 is shown as such; power is led from the lower aluminium electrode layer 52 through a resistor from power source 10.

The area of each capacitor in this embodiment can be as little as 50 square microns for each gate. With a 20 nm tantalum pentoxide layer 51 in an example, a capacitance of at least 0.5 pF was achieved for each gate.

Figure 13:
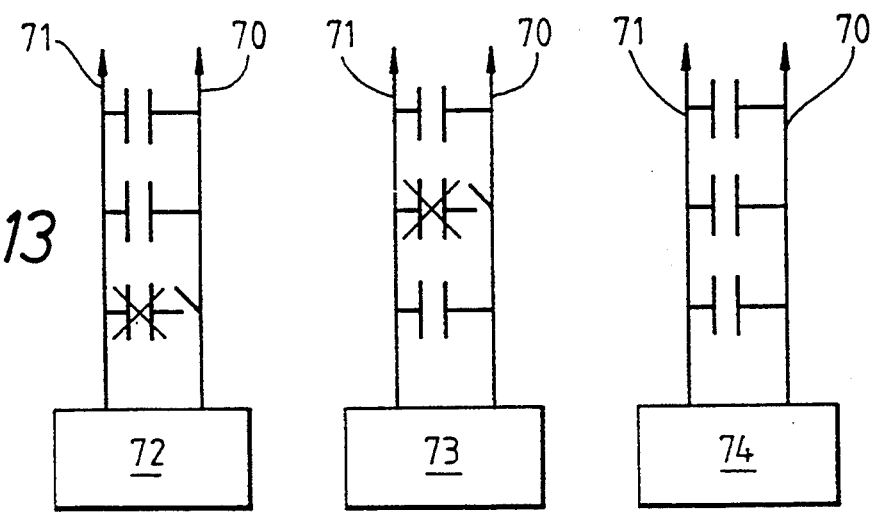
FIG. 13 shows schematically the provision of multiple capacitors for each circuit block of a chip in a fourth embodiment.
Figure 14:
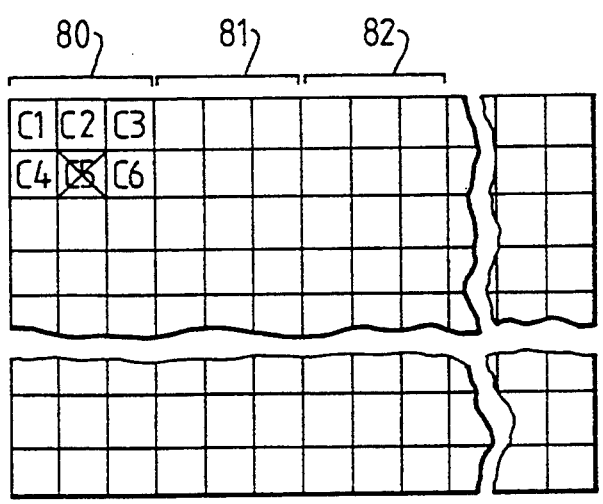
FIG. 14 illustrates this in another way.
Figure 15:
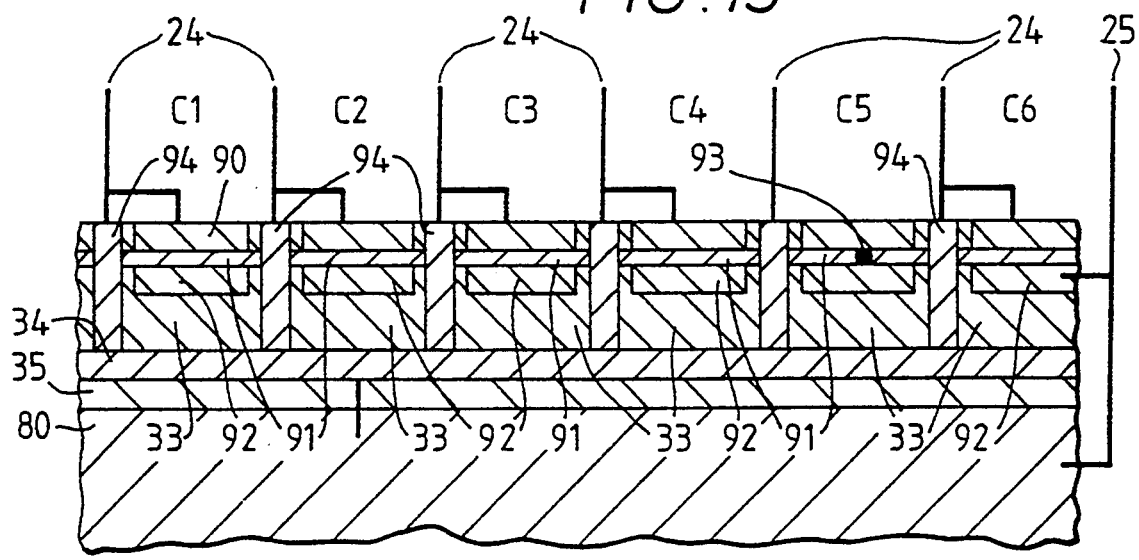
FIG. 15 is a vertical cross-section in the fourth embodiment illustrating connection of the plural capacitors.

FIGS. 13 to 15 illustrate a fourth embodiment. Unlike the embodiments described above, this version is not concerned with providing one capacitor per chip, nor one capacitor per gate. Rather, the aim is to provide several capacitors per block of gates. These blocks correspond to those mentioned above in connection with FIG. 7. FIGS. 13 and 15 illustrate how, initially, these capacitors are not fully connected up. They are connected on the ground sides, but their power source terminals are left open. When manufacturing the chip, the capacitors are individually tested in a manner which is known per se. Capacitors which fail the test by short-circuiting e.g. because of a defect such as a pinhole in the dielectric, are excluded and only the remaining, non-defective capacitors are connected up.

FIG. 13 shows this for three circuit blocks 72, 73, 74 (shown schematically) in which different capacitor status is determined by the test. In the first block 72 the lowermost capacitor is found defective, in the second block 73 the middle capacitor and in the third block 74 all capacitors operate favourably. Accordingly, the chip is completed by forming the capacitor circuits while excluding those capacitors which were found to be defective.

FIG. 14 shows this with reference to a schematic plan view in which, of six capacitors C1–C6 allotted to a given circuit block 80, capacitor C5 is defective.

An actual construction to be used in this case is illustrated in FIG. 15. For simplicity, individual gates are not shown but generic ground and power connections are depicted emerging from the silicon substrate of the circuit block 80. Power source wiring line 34 extends along the substrate, separated from it by insulating layer 35 and communicating to the chip exterior by a number of spaced upward terminals 94. A plurality of individual capacitors C1–C6 are provided at the chip surface, separated from wiring line 34 by low-permittivity layer 33 and positioned adjacent but not connected to terminals 94. In this embodiment, the ground capacitor electrodes are the innermost ones, unlike the previous embodiments. Furthermore, although as seen in the figure the lower electrodes 92 appear to be separate, they are in fact joined in common by a connection which passes round the terminals 94 and does not show because of the section taken. The power electrodes 90, at the surface, are separate. The low-permittivity layer 33 is provided because, as in the first and second embodiments, the capacitors have been formed over a region of substrate including internal circuitry.

In the process of making the chip, first the layers are deposited to form the construction shown. Then, a test is done between a ground terminal (not seen) and the upper aluminium electrode 90 of each of the many capacitors. Where these are found to function properly, the top electrode 90 is connected to the adjacent terminal 94 e.g. by laser-controlled plating. This method has the advantage that wiring lines can be formed in selected parts without using a mask. The plated connections are shown in FIG. 15 as bold lines branching from the power sub-connections 24. FIG. 15 also shows that one of the capacitors C5 has a dielectric pinhole fault and short circuits in the test. For this capacitor, the plating machine is programmed to make no connection.

By this means, the largest possible capacitance is achieved without using the faulty capacitor. The great advantage of this construction is the redundancy it provides. Despite the presence of faulty capacitors, any given chip will almost always be serviceable. It is only a matter of identifying the faulty capacitors. This can be compared with the situation where only one capacitor is provided for one set of circuitry, or even for the whole chip. Any fault in that capacitor inevitably means that the entire chip is useless.

Figure 17A:
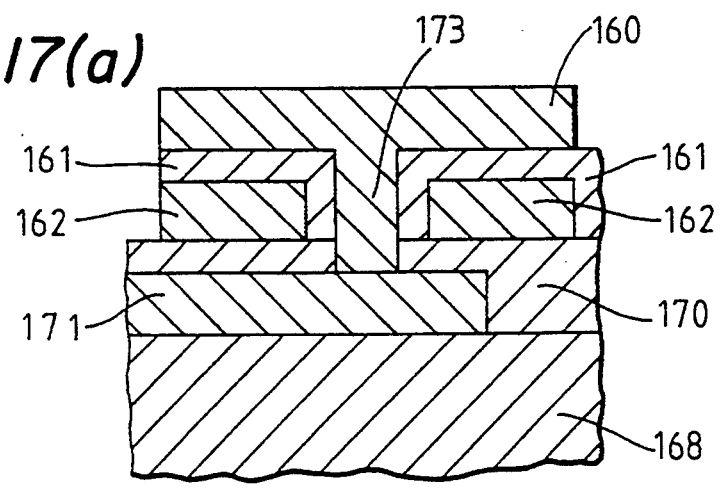
FIGS. 17(a) and 17(b) are vertical cross-sections respectively at H and I in FIG. 16.
Figure 17B:
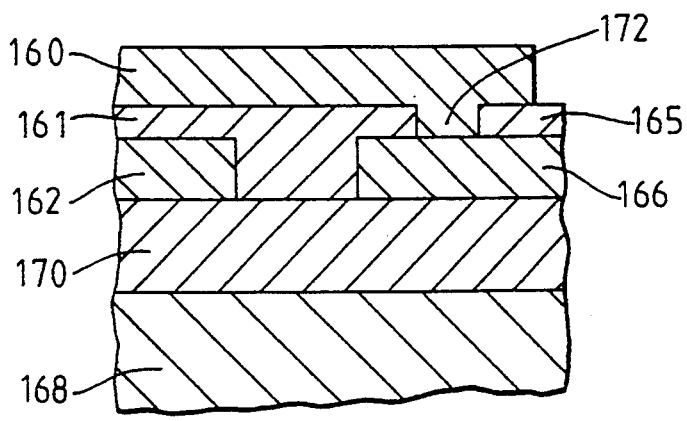
Figure 16:
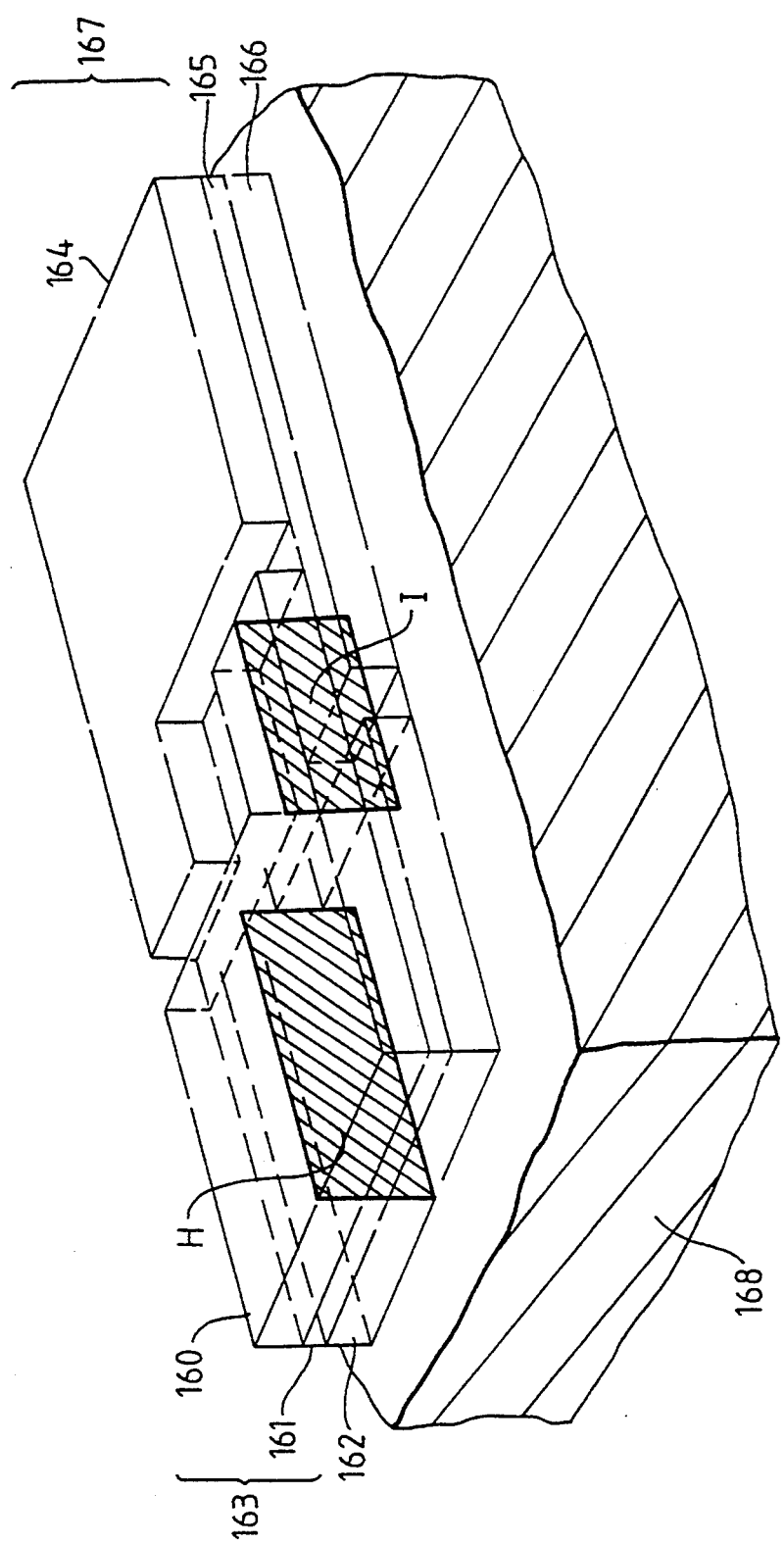
FIG. 16 is a perspective schematic view of a capacitor portion of a fifth embodiment.

FIGS. 16, 17(a) and 17(b) illustrate a fifth embodiment in which a special shape of the capacitor is used. FIG. 16 is a schematic perspective view showing a capacitive bonding pad arrangement at the front surface of a portion 168 of silicon substrate. A first capacitive bonding pad 163 and a second capacitive bonding pad 167 are shown. These are for connection to separate respective wiring lines. The first bonding pad 163 comprises a first upper aluminium electrode layer 160, overlying a first lower aluminium electrode layer 162 from which it is separated by a tantalum pentoxide dielectric layer 161. On the right-hand side of the generally rectangular arrangement, as seen in FIG. 16, a second upper electrode layer 164, separate from the first one, correspondingly overlaps a second lower electrode layer 166 with a second tantalum pentoxide dielectric layer 165 interposed. Although the two upper layers 160, 164 are separate from one another, they include complementary projections and cut-outs so that they form an interlocking shape. In the example shown, each upper layer has a projecting limb at one edge which projects into a corresponding rectangular cut-out of the other upper layer. The lower layers 162, 166 do not however have corresponding cut-outs. Consequently, the upper layer on one side overlaps the part of the lower layer on the other side at the projecting limb portion. Furthermore, these cross-overlapping portions are electrically connected to one another using through-holes in the dielectric layers 161, 165. This can be seen in FIG. 17(b), which is a cross-section at I in FIG. 16. This is the position where the first upper electrode layer 160 overlaps the second lower electrode layer 166 at the projecting limb of the former. FIG. 17(b) shows how a through-hole 172 is formed in the dielectric layer 165 and aluminium deposited through this hole connects the above-mentioned electrode layers electrically. A similar connection is provided for the right-hand upper electrode layer 164 visa vis the left-hand lower electrode layer 162 at their overlap. Consequently, each upper electrode layer on one side forms a single electrode with the lower electrode layer of the other side.

FIGS. 17(a) and (b) shows the silicon substrate 168 without showing any internal circuits therein, nor any insulating oxide film used to insulate the circuitry from internal wiring lines. In FIG. 17(b), only the thick silicon oxide film 170, the outermost layer of the initial IC, is seen under the capacitor layers. In fact, the left-hand and right-hand tantalum pentoxide layers 161 and 165 are in this example a single continuous thin film formed in one process, but interrupted to allow the necessary electrical connections.

It will be appreciated that, because of the cross-connection of the electrode layers, each electrode forms a capacitor twice as large as would be achieved if the two bonding pads were constructed separately from one another. The capacitors are connected in parallel.

A further feature of the cross-connection will be appreciated when it is seen how each top bonding layer 160, 164 is electrically connected to its corresponding wiring line. This is shown in FIG. 17(a) which is a section at H in FIG. 16. A wiring line 171 is shown in FIG. 17(a), separated from the capacitor construction by silicon oxide film 170 and extending away in the left-hand direction. Above this wiring line 171, the first lower electrode layer 162 has a through-hole 173, and a conductive connection extends down through this hole from the first upper electrode layer 160. The conductive connection extending through the hole 173 is insulated from the lower electrode layer 162 by a surrounding downward extension of the insulating dielectric 161. Again, a similar construction is realised on the other side of the bonding pad arrangement to connect the second upper electrode 164 down to a corresponding wiring line (not shown) extending away in the right-hand direction. The consequence is that, when the two bonding pads are connected to the wiring lines from a package, each upper electrode is as a matter of fact connected to the wiring line which lies directly underneath it. This corresponds with a conventional bonding pad, in which the internal wiring line leading to the bonding pad is directly connected thereto. Thus, when making connections to these bonding pads it is not necessary to take special account of their capacitive construction. It will be appreciated that a construction as described can avoid the difficulty of having to lead around a long wiring line as was discussed above in relation to the construction of capacitive bonding pads. Generally, it will be understood that the illustrated structure is advantageous in avoiding confusions in design and manufacture.

To increase the capacitance still more, that part of the silicon oxide film 170 which is sandwiched between a lower aluminium electrode 162 and the internal aluminium wiring line 171 can be reduced in thickness to gain the effect of a two-layer capacitor.

Figure 18:
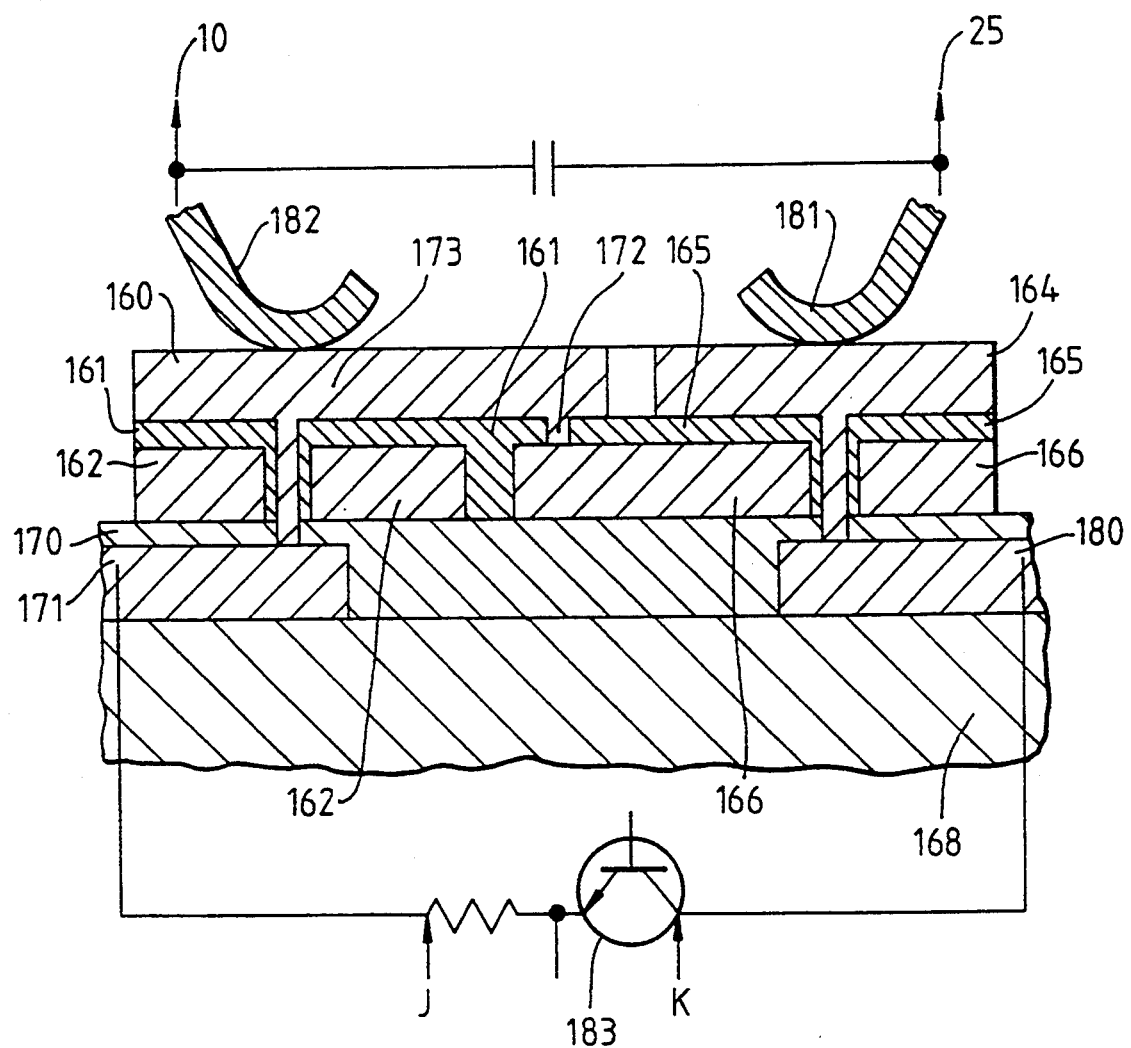
FIG. 18 shows how bonding wires are joined to the bonding pads of the fifth embodiment.

FIG. 18 illustrates in vertical cross-section an application of this double bonding-pad construction with the cross-connected electrodes. The section shows, for both of the upper electrodes 160, 164, the connection down through to the corresponding wiring line 171, 180. The upper part of the figure depicts schematically wiring within the package (not shown) terminating in power source wire 182 and ground wire 181. The circuitry within the chip is not shown, but this is indicated symbolically under the section to make clear that this part of the circuit represents an output portion of an ECL circuit as was shown in FIG. 3.

As seen in FIG. 18, the left-hand wiring line is for a power source $V_{TT}10$, while the right-hand wiring line is for ground 25. Outside the chip, but inside the package and near the chip, a relatively large capacitor (0.1 $\mu$F) is connected between power source and ground and cuts out noise developing away from the package. The chip is connnected by wire bonding the power source wire end 182 to the upper aluminium electrode 160 on the left-hand bonding pad 163, while the piece of wire 181 on the ground side is bonded to the upper aluminium electrode 164 of the right-hand bonding pad 167. It should be noted that, ordinarily, places with wire bonding have a large inductive component and would be unsuitable for high-speed signal processing. With the bonding pads as shown here, however, this problem is overcome and the wire bonded locations are usable as power terminals in a high-speed circuit.

FIG. 18 also shows clearly the advantage described above, that each piece of wire 182, 181 connects as a matter of fact to the wiring line 171, 180 physically directly beneath it.

The potentials of the power source 10 and of the ground 25 are transmitted to the left-hand and right-hand upper electrodes 160, 164 respectively, and thence via the central cross-connecting through-holes 172 to the lower electrodes 162, 166 on the opposite sides. The potential difference is applied across the faces of the tantalum pentoxide layers 161, 165 which therefore fulfil the function of a smoothing capacitor absorbing small-scale potential fluctuations. In an example, the bonding pad was made 150 microns square and the tantalum pentoxide film was 0.05 microns thick. With the parallel connection of the two bonding pad capacitors, as described above, the capacitance was about 240 pF and gave useful effects as a bypass capacitor for a power source arranged as described above. The power source and ground potentials, smoothed by their respective capacitive bonding pads, were transmitted via the through-holes 173 to the respective wiring lines 171, 180. Then, they were respectively supplied to the emitter-follower resistor of the ECL circuit and to the collector of the transistor 183 thereof. The voltage fluctuation across circuit feed points (see points J and K in FIG. 18) as the transistor 183 was switched was about 15 mV. Using only the externally-connected 0.1 $\mu$F capacitor, the fluctuation at these points was about 80 mV thus amply demonstrating the effectiveness of the capacitive bonding pads.

Figure 19:
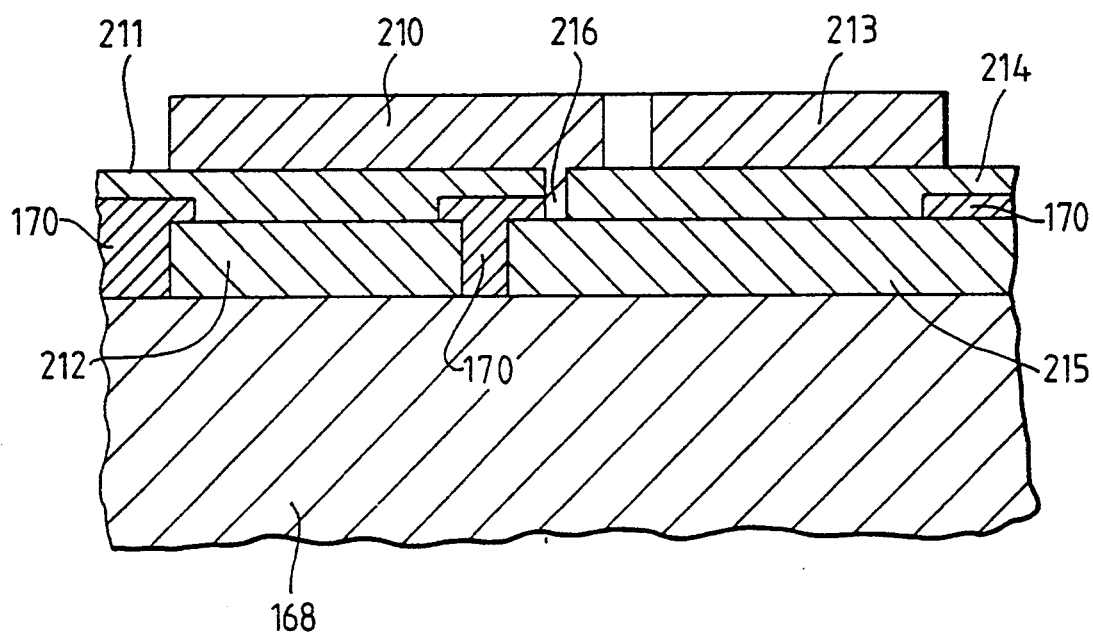
FIG. 19 is a vertical cross-section of a capacitive electrode construction in a sixth embodiment.
Figure 20:
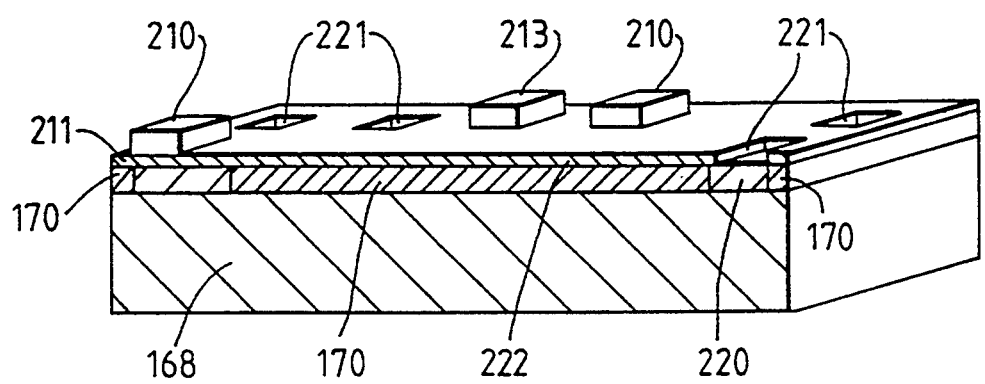
FIG. 20 is a schematic perspective view of an IC chip surface, showing the electrodes.

FIGS. 19 and 20 are respectively a fragmentary vertical section and a partially-sectioned schematic perspective view of a sixth embodiment of chip. FIG. 19 shows the details of a double bonding pad structure. The general features of this are similar to those in the fifth embodiment. The primary difference is that the separate bottom electrodes of the capacitors are omitted and this function is served instead by the wiring line layers themselves. Therefore, a high dielectric layer is interposed directly between the upper bonding pad electrode and the wiring line beneath.

More particularly, FIG. 19 shows left-hand and right-hand wiring line portions 212, 215 disposed side by side over a silicon substrate 168. Circuitry within the substrate and an oxide film for insulating the circuitry from the wiring lines are not shown, for simplicity. Around the wiring lines 212, 215, a thick low-permittivity silicon oxide film 170 extends. Silicon oxide 170 also occupies the space between the two wiring lines. A left-hand upper electrode 210 is superimposed over the left-hand wiring line 212 and a right-hand upper bonding electrode 213 over the right-hand wiring line 215. That is the general disposition, but as in the fifth embodiment each upper electrode has a projecting limb portion which overlaps the wiring line on the other side. The limb of the left-hand electrode 210 is seen in FIG. 19, and is connected down to the right-hand wiring line 215 at through-connection 216. The right-hand electrode and left-hand wiring line are similarly cross-connected although this cannot be seen in the figure. The spaces between the upper electrodes and the wiring lines are filled with tantalum pentoxide dielectric layers 211, 214. These exclusively occupy the dielectric space, but away from the capacitor are superimposed on the thick silicon oxide layer 170. In fact, the excess thickness of silicon oxide layer 170 vis a vis the wiring lines 212, 215 would normally give rise to a raised portion of the tantalum pentoxide layers away from the capacitor, since the tantalum pentoxide layer would be of uniform thickness.

In this embodiment as in the fifth embodiment, each of the upper bonding pads 210, 213 derives extra capacitance from being cross-connected to a further area of wiring line which opposes a bonding pad across a dielectric layer. It is simpler than the fifth embodiment and hence cheaper to manufacture. However it lacks an advantageous feature of the fifth embodiment, in that the uppermost bonding pad layer and the wiring line to which it is connected electrically are not superimposed in one-to-one correspondence. The connections are crossed and this must be taken into account when attaching bonding wires.

FIG. 20 shows schematically part of a chip incorporating paired bonding and ground electrodes according to this embodiment. They are shown simplified in FIG. 20. A pair of power and ground pads is shown in the centre of the figure; the pad 210 at the left-hand end of the figure, shown in section, is the only one shown of another such pair. It will be noted that the special cross-connected capacitive bonding pads have a two-layer structure and therefore protrude above the front surface of the chip. Other bonding pads 221 are shown. These are for signals and do not require the features of the present invention; consequently they have a simple one-layer structure and are recessed from the front surface like a conventional wire bonding pad.

The dielectric used in the capacitive bonding pads is, as above, tantalum pentoxide. Since this has excellent moisture and chemical resistance it can serve additionally as the final passivation film of the chip. A tantalum pentoxide passivation layer 222 is shown in FIG. 20. Where this layer extends under the bonding pads, it serves as a dielectric for the capacitors. Elsewhere it serves for passivation. The high dielectric constant of the tantalum pentoxide layer raises an issue of stray capacitance. However, the underlying silicon oxide film 170 of low dielectric constant, and 3 microns thick, prevents this by acting as a subbing layer.

Each bonding pad is 150 microns square, and the tantalum pentoxide film is 0.05 microns thick. Furthermore, the capacitors of the two bonding pads are connected in parallel. The capacitance is accordingly about 240 pF, well in excess of 100 pF which is itself an ample value for a power source bypass capacitor arranged on an IC chip.

Figure 21:
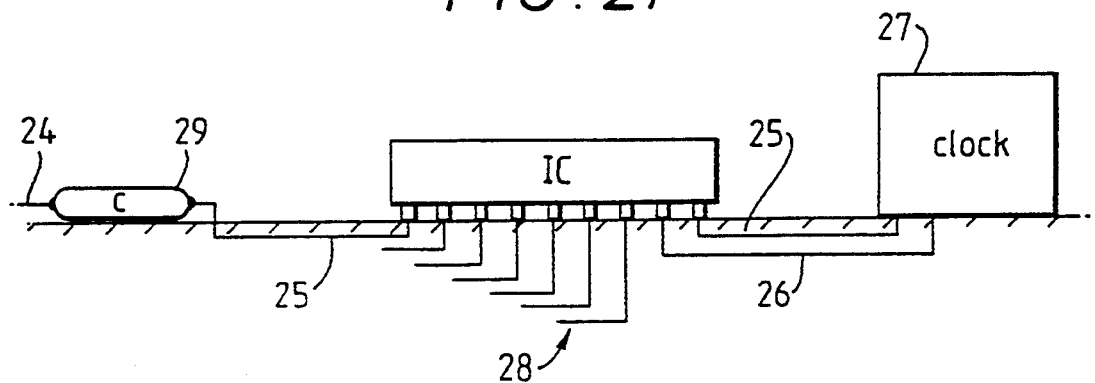
FIG. 21 is a schematic elevation showing an IC chip, an external bypass capacitor and a frequency generator.

FIG. 21 shows (schematically) the IC chip connected into a package with external connections of a high-frequency semiconductor circuit device such as a computer. A clock generator 27 generates a 1 GHz operating frequency signal conveyed to the chip circuitry by a clock signal line 26. A ground line 25 also connects chip and clock. Numerous other wiring connections 28 e.g. signal connections etc., are made to the chip from the external circuitry via the package.

In the drawing, a ground 25 for internal circuits in the chip is indicated at the left-hand end, and a large by-pass capacitor, e.g. of 0.1 $\mu$F is connected between that ground 25 and the power line 24 to the chip.

MAKING THE DIELECTRIC

Because the capacitors used in these embodiments are necessarily small, it is important that a good dielectric is used. As has been discussed above, tantalum pentoxide serves well as a dielectric. We now describe below various ways of forming the chips with the layers, including capacitors, on their front surfaces. Also, particular ways of making good dielectric layers are discussed.

We do not consider the manner of forming the integrated circuit components in the silicon wafer, since this can be entirely conventional.

A general process in term of the fifth embodiment (FIGS. 16 to 18) runs as follows.
(1) The silicon wafer is prepared, with IC circuitry included by conventional means.
(2) An aluminium film is vacuum deposited to a thickness of 2 microns, to form the lower electrodes 162, 166 while the substrate is heated at 200° C.
(3) Using a photoresist mask, the deposited aluminium layer is etched with mixed acids, containing phosphoric acid as a principal component, to shape the lower electrodes.
(4) A film of tantalum pentoxide, for the dielectric layer, is laid down.
(5) The tantalum pentoxide film is shaped to the appropriate pattern.
(6) An aluminium film for the upper electrodes 160, 164 is formed in the same manner as the lower electrodes.
(7) The upper aluminium film is shaped to form the upper electrodes, as in step (3).

Conversely, to form the structure of the sixth embodiment (FIGS. 19 and 20) steps (2) and (3) above are omitted since the lower electrodes are formed by the wiring lines already made in stage (1).

While any of the above steps may be carried out in a per se conventional way, there are particular advantages associated with a special method of forming and shaping the dielectric film. A more general discussion of these methods and of the materials they produce will be found in our EP-A-413. 564. Some further details are given below.

Generally, this preferred process is characterised by irradiating a solution containing metal alkoxide with light of a wavelength corresponding to the binding energy of a metal-alkoxy group to promote decomposition. The irradiation may be carried out either before or after forming a film of the solution on a substrate. Unreacted metal alkoxide can be dissolved away. The film on the substrate is then irradiated so as to generate ozone.

Film Forming: Embodiment 1

Figure 22:
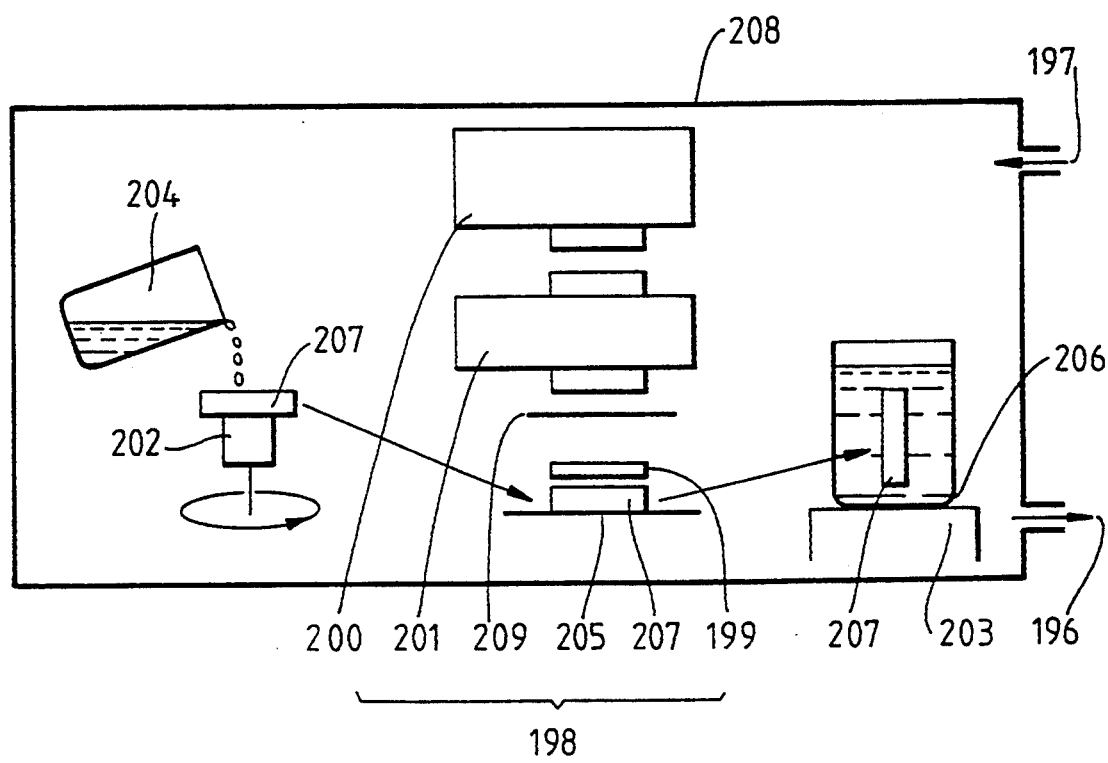
FIG. 22 is a schematic diagram of apparatus for making a dielectric film.

FIG. 22 shows apparatus schematically. A box 208 has an atmosphere exchangeable through ports 196, 197 and contains an exposing device 198 including a light radiating device 200 (e.g. an ultraviolet lamp), a monochromator 201 for selecting light of a specified wavelength, an adjustable stage 205 for supporting a substrate 207 and a shutter mechanism 209 for allowing irradiation with the selected light. Relative positioning of a photomask 199 over the substrate 207 is achieved by an automatic or manual pattern-recognising and positioning mechanism (not shown). To the left of the exposure device is a spinner 202 for spinning a substrate 207 to coat it evenly with solution from a beaker 204. On the right, beaker 206 contains a liquid for removing residual reaction solution from the substrate 207 after film-forming, aided by an ultrasonic vibrator 203.

(i) A tantalum ethoxide solution was prepared (0.05 mol of tantalum ethoxide:1 l ethanol). 2 ml of the tantalum ethoxide solution were mixed with 8 ml of ethanol (0.05 mol water:1 l ethanol) and 2.5 ml of hydrochloric acid/ethanol (0.1 mol HCl:1 l ethanol). 2 ml of ethanol was added to the mixture to form a solution which was dropped into beaker 204 at 3 ml/minute. The solution was transparent and homogeneous. Solution was dripped onto the middle of the substrate 27 and the spinner 202 was rotated at about 4000 rpm to form a uniform film of the solution on the substrate 207.

(ii) With the substrate 207 on the stage 205 of the exposure device 198, the photomask pattern 199 was positioned appropriately by means not shown. Monochromatic light of 254 nm (tantalum-ethoxy binding energy) was then irradiated for 30 minutes so that, in the exposed parts of the solution, the tantalum ethoxide was broken down to an ethanol-insoluble substance.

(iii) Unreacted tantalum ethoxide was removed in the vibrating ethanol-filled beaker 206.

(iv) The substrate was replaced on the stage 205 and, with the mask removed, re-irradiated with 184 nm radiation to produce ozone in the surrounding pure air atmosphere. Irradiation proceeded for about 10 minutes, to convert the patterned film on the substrate 207 into tantalum pentoxide.

By an ESCA the resulting film was found to have only 4.0 atm % remaining organic matter, and a $TaO_x$- composition ratio (O/Ta) of 2.2. This is close to the stoichiometric ratio and the organic matter content was very small.

This is a highly advantageous way of forming a tantalum pentoxide film. Normally, films have to be etched. It is known that tantalum pentoxide can be etched with fluoric acid. However, this acid also etches aluminium and silicon dioxide which form the other films. So, the conventional etching cannot shape the tantalum pentoxide without affecting the subbing layers. With the present method however the pattern is made by irradiation, without even needing to use a photosensitive etching resist.

Film Forming: Embodiment 2

Figure 1:
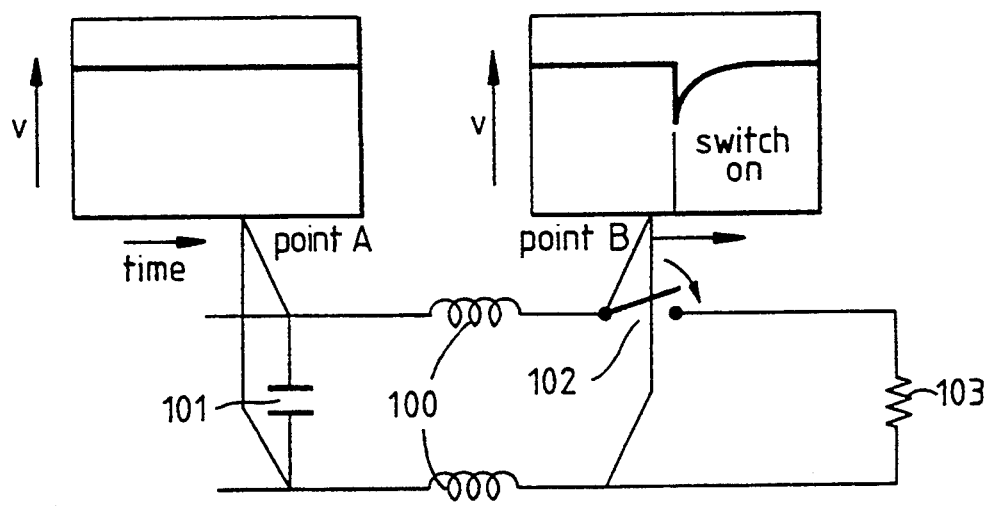
FIG. 1 is a schematic diagram illustrating switching inductance.

(i) A transparent homogeneous solution containing tantalum ethoxide was prepared as in film forming embodiment 1. Apparatus used was as shown in FIG. 1 of EP-A-413 564.

(ii) The solution was stirred in a beaker by a magnetic stirrer.

(iii) The solution was irradiated in the beaker using selected monochromatic light of 254 nm for about 30 minutes.

(iv) The prepared silicon substrate was immersed in the solution using an immersing device of the apparatus.

(v) The substrate thus dipped was re-irradiated with ozone-producing monochromatic light of 184 nm for about 10 minutes. Ozone was generated in the pure air environment and the formed film was oxidised to tantalum pentoxide.

Since the tantalum pentoxide is soluble only in fluoric acid which would damage the subbing layers, pattern formation was carried out by ion milling as follows:

(a) The substrate front surface was spin-coated with a photoresist;

(b) A photomask pattern was transferred onto the photoresist and developed, in a conventional way;

(c) After being subjected to a vacuum of about $10^{-4}$ Pa, the substrate was subjected to ion milling in an argon atmosphere of $2 \times 10^{-2}$ Pa for 2 minutes, with acceleration and deceleration voltages of 600 V and 150 V respectively, and ion density of 0.5 mA/cm$^2$.

(d) The ion irradiated portions of the film were thus removed.

This dipping method is clearly suitable for making a large area dielectric film, as in the sixth chip embodiment described above where the tantalum pentoxide covers substantially the entire front surface. Compared with the spin-coating method of film forming embodiment 1 above, it is however more difficult to control the film thickness.

It will be appreciated that other conventional methods of forming thin films may be used instead.

Film Forming: Embodiment 3

It has been stressed above that for the small capacitors comprised in the chips, a dielectric having a specific dielectric constant of at least 10 will normally be needed. The higher the dielectric which can be achieved, the smaller the capacitors can be made and hence the more compact the assembly. For example, if capacitive bonding pads are made only 100 microns square a material of higher dielectric constant than the tantalum pentoxide will be needed. However, dielectrics with very high constants of e.g. several thousand or above are generally inferior at high frequencies. In particular, their dielectric properties drop off below 1 GHz.

We find that a useful dielectric for present purposes is a composite oxide of barium, lead, neodymium and titanium (BaO.PbO.Nd$_2$O$_3$.4TiO$_2$). This has a relative dielectric constant as much as 90 at 1 GHz. Other composite oxides containing barium and titanium oxides also have high dielectric constants and undergo little dielectric loss even at high frequencies. Therefore other oxides of this type are suitable. However the particular composite mentioned above is especially good because its relative dielectric constant is as high as about 90.

With a bonding pad 100 microns square, a composite oxide film 0.05 microns thick, and a dielectric constant of 90, capacitance of about 300 pF can be achieved using parallel connection of the capacitors in two bonding pads as shown in the sixth embodiment above.

A composite oxide film of high relative dielectric constant was prepared as follows.

(a) 1.37 g (0.01 mol) of barium (Ba) and 80 ml of isopropyl alcohol (i-C$_3$H$_7$OH) were put in a four-mouthed flask provided with a reflux tube, and circulated in nitrogen at 80° C. for 30 minutes using an oil bath. Barium alkoxide was formed in solution.

(b) A solution in which 11.3 g (0.04 mol) of titanium alkoxide {Ti(OC$_3$H$_7$)$_4$} was dissolved in 100 ml of isopropyl alcohol, a solution in which 3.25 g (0.01 mol) of lead alkoxide {Pb(OC$_3$H$_7$)$_2$} was dissolved in 50 ml of isopropyl alcohol, and a solution of {Nd(OC$_3$H$_7$)$_3$} which was prepared in such a way that 4.20 g (0.01 mol) of neodymium nitrate {Nd(NO$_3$)$_3$.5H$_2$O} was dissolved in 50 ml of isopropyl alcohol and reacted in nitrogen at 80° C. for 30 minutes, were put in respective dropping funnels, and these were set on the four-mouthed flask from (a).

(c) The Ti(OC$_3$H$_7$)$_4$ solution, the Pb(OC$_3$H$_7$)$_2$ solution and the Nd(OC$_3$H$_7$)$_3$ solution were simultaneously dropped in over 1 hour. The reaction solution was then agitated for 2 hours at 80° C.

(d) A solution in which 1.26 g (0.07 mol) of water and 6 g (0.17 mol) of acetic acid were dissolved in 30 ml of isopropyl alcohol was dropped in over 30 minutes.

(e) The solution was then agitated at 80° C. for 2 hours, and a Liebig cooling tube fitted for reduced-pressure distillation.

(f) The isopropyl alcohol reaction medium was removed by distillation, concentrating the solution to 100 ml.

(g) The concentrated solution was applied to the chip substrate using a spinner. A film thickness of about 0.01 μm was attained in one application. In order to obtain a perfect continuous film, five applications were used in this example.

(h) The film thus prepared was: heat-treated in the air at 400° C. for 1 hour to give a thin film of BaO.PbO.Nd$_2$O$_3$.4TiO$_2$.

It should be noted that composite oxides such as that described above cannot normally be formed by conventional film-forming processes such as evaporation or sputtering. Sputtering or vaporising energy is likely to break bonds in the composite oxide; also the different constituents have different vapour pressures and some deposit selectively so that the composition is non-uniform. Furthermore, an evacuated environment tends to reduce and a sputtering process would need to use an oxygen-containing atmosphere rather than argon.

In contrast, the solution-deposition method described does not require any heating such as would decompose the composite oxide.

Film Forming: Embodiment 4

A simpler composite oxide, therefore easier to synthesise, is a composite oxide of barium, titanium and tungsten ($BaO.4TiO_2.0.1WO_3$).

Synthesis was as follows.

(a) Barium alkoxide solution was formed as in the previous embodiment, but in a three-mouthed flask.

(b) Titanium alkoxide solution was prepared as in the previous example. Also, 0.4 g (0.001 mol) of tungsten alkoxide $\{W(OC_2H_5)_5\}$ was dissolved in 50 ml of isopropyl alcohol and reacted in nitrogen at 80° C. for 30 minutes.

(c) The titanium and tungsten solutions were dropped into the barium solution over 1 hour. The reaction solution was then agitated for 2 hours at 80° C.

(d) An acetic acid solution (1.8 g (0.1 mol) water, 4.2 g (0.07 mol) acetic acid, 20 ml isopropyl alcohol) was dropped into the reaction solution over 30 minutes.

(e) The solution was then stirred, concentrated, applied and heat treated as in the previous embodiment, to produce a thin film of $BaO.4TiO_2.0.1WO_3$.

The relative dielectric constant of the film at 1 GHz was about 60, i.e. less than in the previous embodiment although the film is easier to make.

The last two embodiments above illustrate how the alkoxides of barium, neodymium and tungsten can be produced by heating and circulating the starting materials in isopropyl alcohol, and then used in solution, even though the alkoxides themselves are rather unstable. It should be noted that methods applied with one, coating substance may be applicable to the other substances in the other embodiments.

The dielectric layers described so far have all been single layers having relative dielectric constant of at least 10. It is known that increased capacitance can sometimes be obtained by stacking a plurality of dielectrics, each preferably having a constant of at least 10. This possibility, generally known in relation to capacitors, is included in the present invention.

It will be appreciated that many other dielectric materials may be used. Normally they should have a relative dielectric constant of at least 10 and this should be maintained at a high frequency, preferably at or above 1 GHz. Examples of suitable materials include $TiO_2$, $SnO_2.TiO_2$, $ZrTiO_4$, $(ZnSn)TiO_4$, $(Zr_{0.8}Sn_{0.2})TiO_4$, $BaTi_4O_3$, $Ba_2Ti_9O_{20}$, $La_2Ti_2O_7$, $Nd_2Ti_2O_7$, $Ca_2Nd_2O_7$, $Sr_2Nd_2O_7$, $MgTiO_3$, $CaTiO_3$, $SrTiO_3$, and $SrZrO_3$.

System Embodiments

The preferred semiconductor integrated circuit chips including the special bonding pad electrodes, giving an in-chip capacitance of at least 100 pF between power source and ground, are fitted in a conventional manner to packages. In a supercomputer system, a three-dimensional array of these packages is formed by mounting them on stacked multilayer printed circuit boards to form platters. The platters can be spaced for the introduction of cooling air through e.g. a cross-flow grid to reduce non-uniformity in cooling.

The packages may be logic packages, vector register packages, main storage packages, expanded storage packages or the like, all of which can be comprised in the highly integrated logic platter.

In examples, a logic package may be a logic LSI, a RAM module VR may be a logic LSI or a VRLSI, and a main storage package may be a dynamic random access memory. Many other possibilities are known to the skilled man. The packages may be mounted on printed circuit boards e.g. by surface installation, axial installation, two-surface installation and the like.

Using the special features described herein a supercomputer of high operating speed—in preferred embodiments, at or above 1 GHz—can be made and yet noises ascribed to inductive components can be sufficiently excluded to achieve good operation.

We claim:

1. A method of operating internal circuitry in a semiconductor integrated circuit chip at a frequency of at least 1 Ghz, comprising:

supplying power to the internal circuitry along a power connection;

grounding the internal circuitry by a ground connection' reducing external circuit noise by connecting a first capacitor between said power connection and said ground connection externally of said chip, and reducing noise caused by the high frequency operation of the internal circuitry and circuit noise between the first capacitor and the internal circuitry by a second capacitor having a smaller capacitance than the first capacitor, said second capacitor being comprised in the chip and connection between said power connection and said ground connection.

2. A high-frequency operable semiconductor integrated circuit device comprising:

(a) an integrated circuit chip, said chip comprising internal circuitry operable at high frequency;

(b) external circuitry, said external circuitry comprising a power source connection and a ground connection connected to said chip and to the internal circuitry thereof, and at least one first capacitor connected between said power source connection and said ground connection to reduce external circuit noise, and (c) means for reducing noise generated by the high frequency operation of the internal circuitry and noise between the at least one first capacitor and the internal circuitry comprising at least one second capacitor, said at least one second capacitor having a smaller capacitance than said at least one first capacitor, comprised integrally in said integrated circuit chip, and connected between said power source and ground connections to said internal circuitry.

3. A device as claimed in claim 2 in which said at least one second capacitor is formed at a front surface of said chip.

4. A device as claimed in claim 2 in which said chip comprises a plurality of said second capacitors.

5. A device as claimed in claim 2 in which said internal circuitry of said chip comprises a plurality of gates for a logical operation, wherein said at least one second capacitor is connected between said ground connection and said power source connection of said plurality of gates.

6. A device as claimed in claim 4 in which said internal circuitry comprises a plurality of gates, and wherein respective one of said second capacitors are connected for said ground and power source connections to said plurality of gates.

7. A device as claimed in claim 2 in which
said at least one first capacitor has a capacitance of at least 0.05 µF;
the total capacitance of said at least one second capacitor is at least 100 pF and less than 0.05 µF, and
the total combined capacitance of the at least one first capacitor and said at least one second capacitor is at least 0.1 µF.

8. A device as claimed in claim 2, further comprising frequency generating means connected to said chip, for generating an operating frequency of at least 1 GHz for said internal circuitry.

* * * * *